(12) United States Patent
Huang

(10) Patent No.: US 8,134,854 B2
(45) Date of Patent: Mar. 13, 2012

(54) EFUSE DEVICE

(75) Inventor: Rei-Fu Huang, Tainan County (TW)

(73) Assignee: Mediatek Inc., Hsin-Chu (TW)

( * ) Notice: Subject to any disclaimer, the term of this patent is extended or adjusted under 35 U.S.C. 154(b) by 325 days.

(21) Appl. No.: 12/277,495

(22) Filed: Nov. 25, 2008

(65) Prior Publication Data

US 2010/0127757 A1    May 27, 2010

(51) Int. Cl.
*G11C 17/00* (2006.01)

(52) U.S. Cl. ........ 365/96; 365/94; 365/196; 365/210.15

(58) Field of Classification Search .................... 365/96, 365/94, 196, 210.15
See application file for complete search history.

(56) References Cited

U.S. PATENT DOCUMENTS

| 5,723,999 | A  | * | 3/1998  | Merritt ............................ 327/526 |
| 7,710,813 | B1 | * | 5/2010  | Im et al. ........................ 365/225.7 |
| 7,911,820 | B2 | * | 3/2011  | Anand et al. ....................... 365/96 |
| 2005/0247996 | A1 | * | 11/2005 | Chung et al. ..................... 257/529 |
| 2006/0028894 | A1 | * | 2/2006  | Brennan et al. ............. 365/225.7 |
| 2010/0067319 | A1 | * | 3/2010  | Aipperspach et al. ...... 365/225.7 |

* cited by examiner

*Primary Examiner* — Vu Le
*Assistant Examiner* — Han Yang
(74) *Attorney, Agent, or Firm* — Thomas|Kayden

(57) ABSTRACT

An exemplary embodiment of an efuse device is provided, operating in a write mode and a read mode and comprising a source line, a cell, a blow device, and a sensing circuit. The cell has a first terminal coupled to the source line and a second terminal. The blow device is coupled between the second terminal of the cell and a ground terminal. The blow device is turned on in the read mode. The sensing circuit is coupled to the first terminal of the cell and the ground terminal, and is arranged to determine a state of the cell.

17 Claims, 4 Drawing Sheets

EFUSE DEVICE

BACKGROUND OF THE INVENTION

1. Field of the Invention

The invention relates to an efuse device, and more particularly to an efuse device sharing a blow device in read and write modes.

2. Description of the Related Art

FIG. 1 shows a conventional efuse array. Referring to FIG. 1, a 4×2 efuse array 10 is given as an example. The efuse array 10 comprises cells (referring to fuses 100-107) and blow transistors T100-T107. Each of blow transistors T100-T107 is coupled between one cell and a reference voltage. When one cell is determined to be blown in a write mode, the corresponding blow transistor is turned on, and a pad P10 is coupled to a high voltage level, so that a blowing current on a source line SL is provided to the determined cell to blow it. For example, in the write mode, if the fuse 100 is determined to be blown, the blow transistor T100 is turned on, and the blowing current on the source line SL is provided to the fuse 100, so that the fuse 100 is blown (or programmed).

FIG. 2 shows one fuse and a conventional sensing circuit in an efuse device, and the fuse 100 is given as an example in FIG. 2. A sensing circuit 2 comprises a reference resistor R20 and a determination unit 20. The reference resistor R20 has an impedance, and is used to be compared with the impedance of the fuse 100, so that the determination unit 20 determines whether the fuse 100 has been blown or not according to the comparison result in a read mode. Referring to FIG. 2, in the read mode, the blow transistor T100 is turned off, and the pad P10 is coupled to a ground terminal outside of the efuse device. The ground terminal provides a reference voltage for the determination unit 20, so that the determination unit 20 can determine whether the fuse 100 has been blown or not according to the impedances of the fuse 100 and the reference resistor R20. However, if the pad P10 is grounded through an additional switch in the read mode, a slight voltage level may appear on the pad P10. Thus, the Pad P10 is not ideally grounded, which may affect later sensing operation. In other words, the level of the reference voltage undesirably drifts. Thus, the sensing circuit 2 cannot correctly determine whether the fuse 100 has been blown or not.

BRIEF SUMMARY OF THE INVENTION

An exemplary embodiment of an efuse device operates in a write mode and a read mode and comprises a source line, a cell, a blow device, and a sensing circuit. The cell has a first terminal coupled to the source line and a second terminal. The blow device is coupled between the second terminal of the cell and a ground terminal. The blow device is turned on in the read mode. The sensing circuit is coupled to the first terminal of the cell and the ground terminal, and is arranged to determine a state of the cell.

Another exemplary embodiment of an efuse device operates in a write mode and a read mode and comprises a source line, a cell, a blow device, and a sensing circuit. The cell has a first terminal coupled to the source line and a second terminal. The blow device is coupled between the second terminal of the cell and a ground terminal providing a ground voltage. The sensing circuit is coupled to the first terminal of the cell and the ground terminal and comprises a reference resistor. The reference resistor has a first terminal coupled to the sensing circuit and a second terminal which receives the ground voltage in the read mode. In the read mode, the blow device is turned on, and the sensing circuit determines a state of the cell according to impedances of the cell and the reference resistor.

Another exemplary embodiment of an efuse device operates in a write mode and a read mode and comprises a source line, a cell, and a blow device. The cell has a first terminal coupled to the source line and a second terminal. The blow device is coupled between the second terminal of the cell and a ground terminal. In the read mode, the blow device is turned on. When the blow device is turned on in the write mode, the source line provides a current for blowing the cell.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
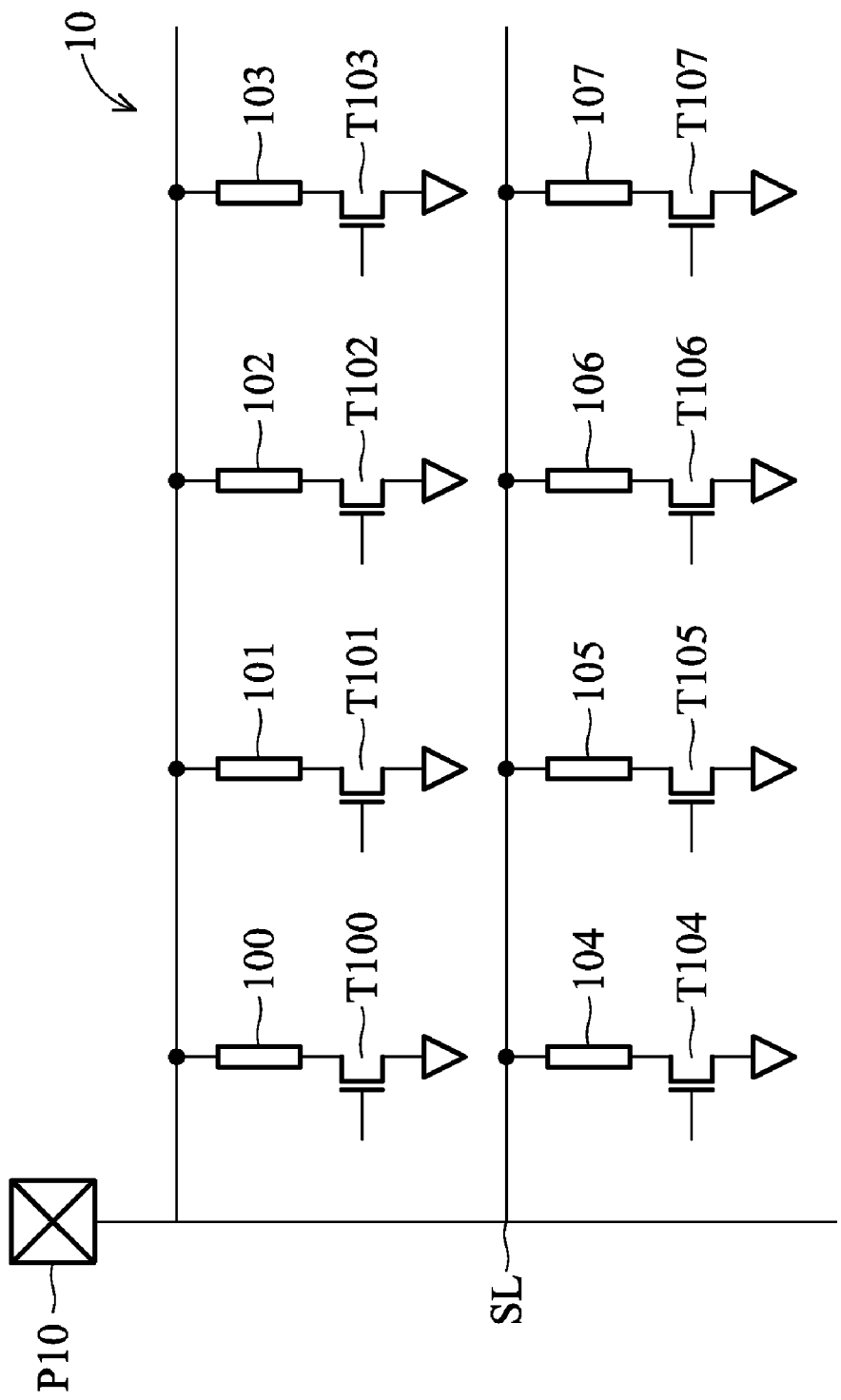
FIG. 1 shows a conventional efuse array.
Figure 2:
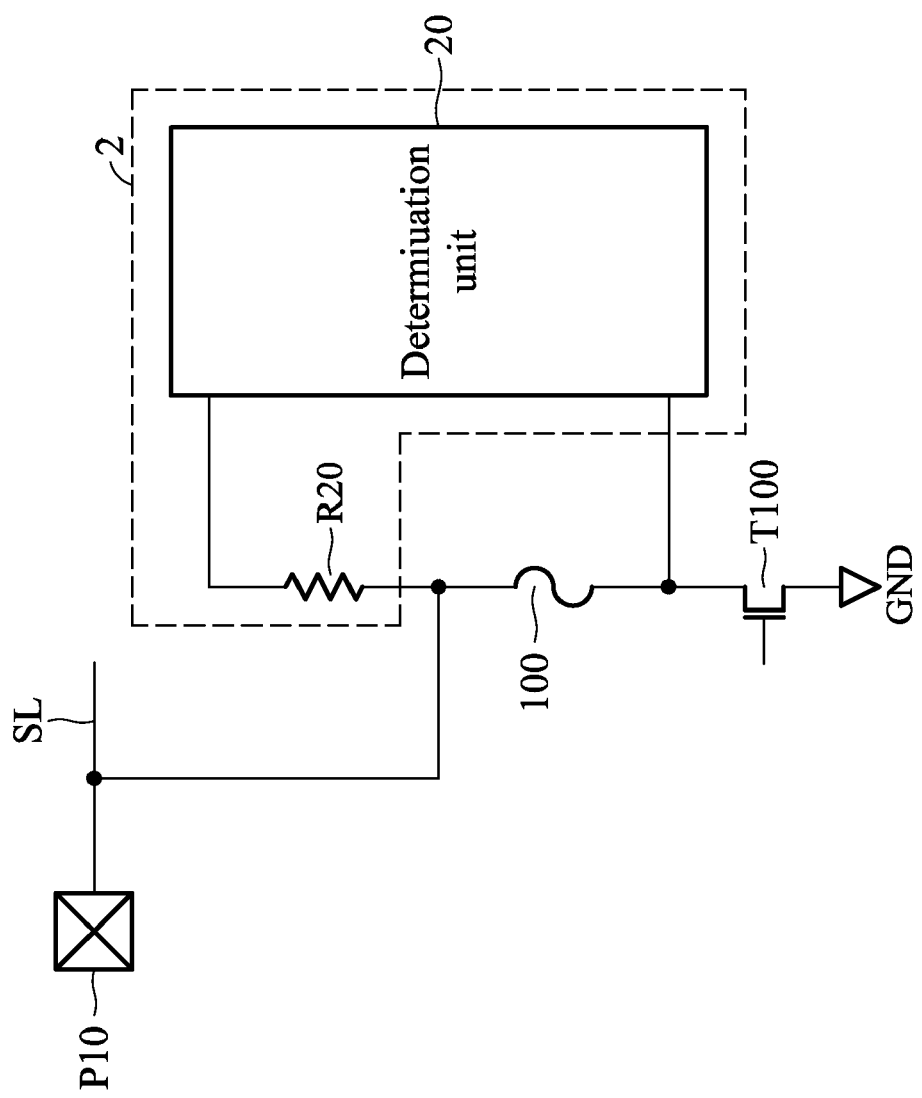
FIG. 2 shows one fuse and a conventional sensing circuit in an efuse device.
Figure 3:
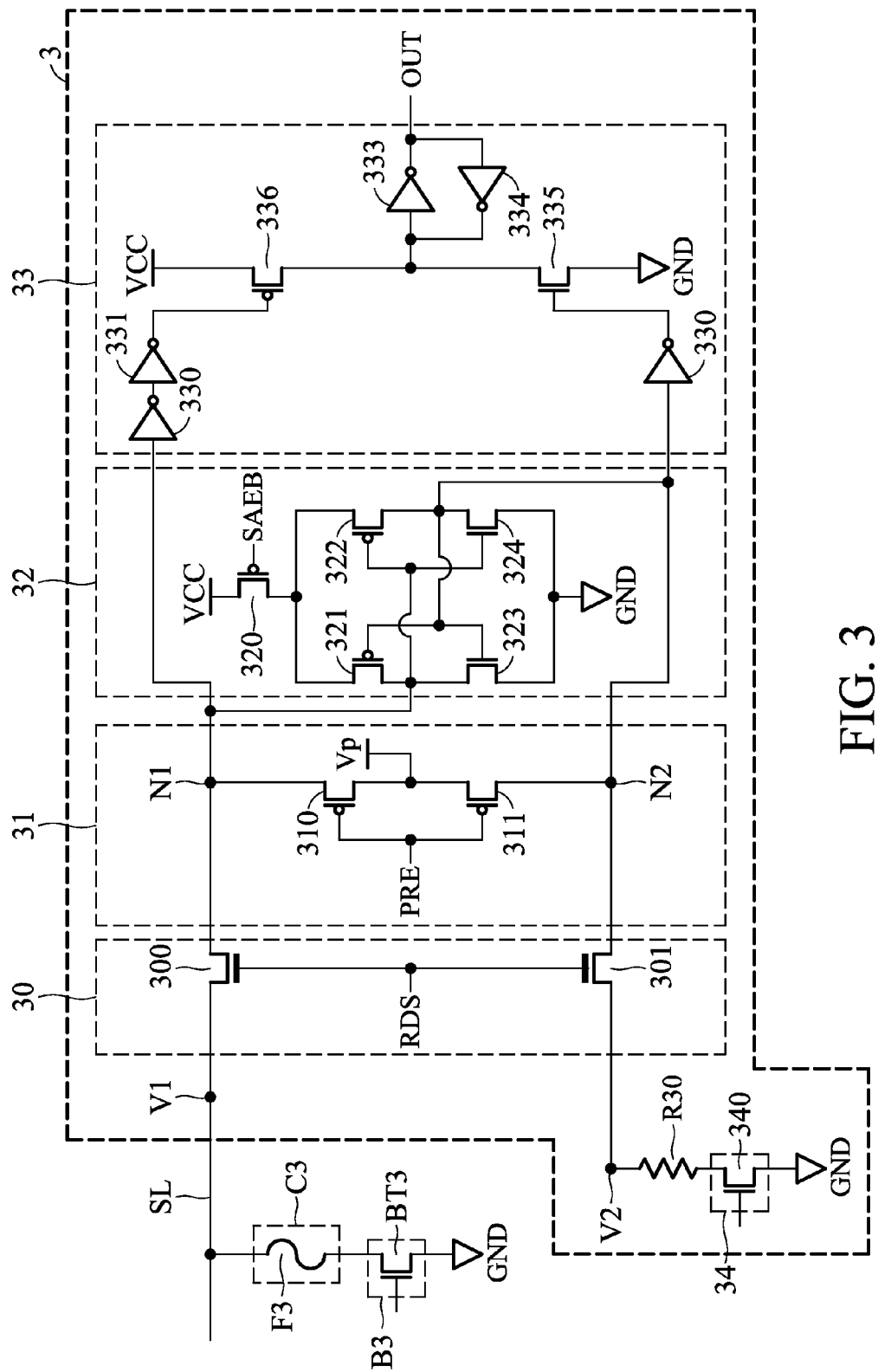
FIG. 3 shows an exemplary embodiment of an efuse device.

FIG. 3 shows an exemplary embodiment of an efuse device. Referring to FIG. 3, the efuse device comprises a cell C3, a blow device B3, and a sensing circuit 3. The cell C3 has a first terminal coupled to a source line SL and a second terminal. The blow device B3 is coupled between the second terminal of the cell C3 and a ground terminal GND. The sensing circuit 3 is coupled to the first terminal of the cell and the ground terminal GND and is arranged to determine a state of the cell C3, such as if the cell C3 has been blown or not. The cell C3 comprises a fuse F3, and two terminals of the fuse respectively correspond to the first and second terminals of the cell C3. In the embodiment, the blow device B3 is implemented by a blow transistor BT3. A drain of the blow transistor BT3 is coupled to the second terminal of the fuse F3, and a source thereof is coupled to the ground terminal GND.

The efuse device may operate in a write mode and a read mode. In the write mode, if it is determined that the fuse F3 must be blown, the blow transistor BT3 is turned on, and a blowing current on the source line SL is provided to the fuse F3 according to the turned-on blow transistor BT3, so that the fuse F3 is blown (or programmed). In the read mode, the blow transistor BT3 is also turned on, and a ground voltage of the ground terminal GND is provided to the second terminal of the blow transistor BT3 to serve as a reference voltage for the sensing circuit 3. The sensing circuit 3 can determine the state of the fuse F3 according to the impedance of the fuse F3 and the ground voltage.

Following is a detailed description of operation of the efuse device in the read mode according to FIG. 3. The sensing circuit 3 requires a reference resistor for to be compared with the impedance of the fuse F3. The sensing circuit 3 may comprise a reference resistor R30, an isolation unit 30, a pre-charging unit 31, an amplifying unit 32, an output unit 33, and a switch device 34. The reference resistor R30 has a first terminal and a second terminal. The switch device 34 is coupled between the second terminal of the reference resistor R30 and the ground terminal GND. In the embodiment, the switch device 34 is implemented by a switch transistor 340, and a drain and a source of the switch transistor 340 are respectively coupled to the second terminal of the reference resistor R30 and the ground terminal GND. The isolation unit 30 is coupled between the first terminal of the reference resistor R30 and the first terminal of the reference resistor R30 and comprises two NMOS transistors 300 and 301 controlled by a read-enable signal RDS. The isolation unit 30 is turned off in the write mode and on in the read mode. The pre-charging unit 31 is coupled to the isolation unit 30 through the input nodes N1 and N2 and comprises two PMOS transistors 310 and 311 controlled by a pre-charge signal PRE. The PMOS transistors 310 and 311 are coupled together at a high voltage level Vp. The amplifying unit 32 is coupled to the input nodes N1 and N2 of the pre-charging unit 31 and comprises PMOS transistors 320-322 and NMOS transistors 323-324, wherein the PMOS transistor 320 is controlled by a sensing signal SAEB. The PMOS transistors 321-322 and NMOS transistors 323-324 compose two inverters in an inverse connection. The output unit 33 is coupled to the amplifying unit 32 and comprises inverters 330-334, an NMOS transistor 335, and a PMOS transistor 336.

Before the isolation unit 30 is turned on, the PMOS transistors 310 and 311 of the pre-charge unit 31 are turned on by the pre-charge signal PRE, so that voltages at the input nodes N1 and N2 of the pre-charge unit 31 are charged to a predetermined level. In this embodiment, the predetermined level is a high level. In the read mode, both the blow transistor BT3 and the switch transistor 340 are turned on, the ground voltage is provided to the second terminal of the fuse F3 and the second terminal of the reference resistor R30. At this time, a voltage V1 of the first terminal of the fuse F3 and a voltage V2 of the first terminal of the reference resistor R30 respectively refer to impedance of the fuse F3 and impedance of the reference resistor R30. V1 and V2 will be different when the impedance of the fuse F3 and that of the reference resistor R30 are different. The impedance of the fuse F3 is greater when the fuse F3 is blown than when it is not blown. The transistors 300 and 301 of the isolation unit 30 are turned on by the read-enable signal RDS. The input nodes N1 and N2 of the pre-charging unit 31 respectively receive the voltage V1 and the voltage V2 through the turned-on isolation unit 30. At this time, the voltages at the input nodes N1 and N2 are equal to the voltages V1 and V2 respectively.

Then, the transistors 300 and 301 of the isolation unit 30 are turned off by the read-enable signal RDS, and the NMOS transistors 310 and 311 of the pre-charge unit 31 are turned off by the pre-charge signal PRE. The PMOS transistor 320 is turned on by the sensing signal SAEB. Next, the amplifying unit 32 begins to amplify the voltages V1 and V2 at the input nodes N1 and N2 to a sufficiently high level. The output unit 33 receives the amplified voltages V1 and V2 and outputs an output signal OUT according to the amplified voltages V1 and V2. The output signal OUT represents the state of the fuse F3. For example, the output signal OUT with logic "1" represent that the fuse F3 has been blown. If the fuse F3 has not been blown by a current, the output signal OUT has a logic "0".

Figure 4:
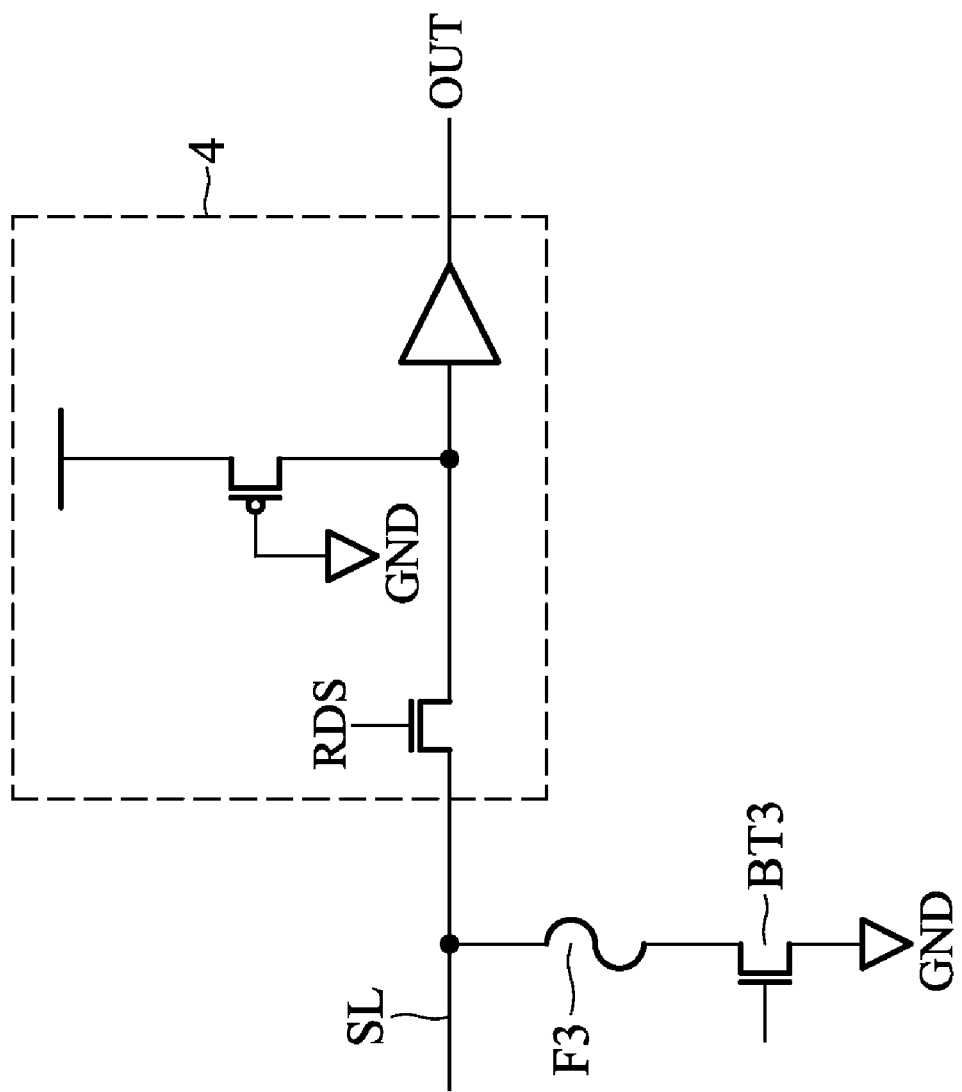
FIG. 4 shows another exemplary embodiment of an efuse device.

In FIGS. 3 and 4, the structure of the sensing circuit 3, the circuitry of units 30-33, and the operation timing of the units 30-33 is given as an example, but are not limited. In different applications, the sensing circuits can have different structures and different operation timings according to requirements.

According to above embodiment, the blow transistor BT3 is shared by the write mode and the read mode. In the write mode, if it is determined that the fuse F3 must be blown, the blow transistor BT3 is turned, and in the read mode, the blow transistor BT3 is also turned on to provide the ground voltage to the second terminal of the fuse F3 to serve as a reference voltage for the sensing circuit 3. Moreover, the reference voltage for the sensing circuit 3 is provided by the ground terminal GND in the efuse device, and not provide by another ground terminal outside of the efuse device through a pad of the source line SL. Thus, the reference voltage has a stable level, and the sensing circuit 3 can correctly determine whether the fuse F3 has been blown or not.

In some embodiments, the switch device 34 can be omitted, and the second terminal of the reference resistor can be directly connected to the ground terminal GND.

FIG. 4 shows another exemplary embodiment of an efuse device. Referring to FIG. 4, in the write mode, if it is determined that the fuse F3 must be blown, the blow transistor BT3 is turned on, and a blowing current on the source line SL is provided to the fuse F3 according to the turned-on blow transistor BT3, so that the fuse F3 is blown (or programmed). In the read mode, the blow transistor BT3 is turned on, and a ground voltage provided from the ground terminal GND is provided to the second terminal of the blow transistor BT3 to serve as a reference voltage for the sensing circuit 4. A reference resistor is not required by the sensing circuit 4 for comparison with the impedance of the fuse F3. The sensing circuit 4 determines the state of the fuse F3 according to only the impedance of the fuse F3 without comparison with an impedance of a reference resistor. Note that the circuitry of the sensing circuit 4 is an example, and not limited. The sensing mechanism of FIG. 4 is like a voltage divider between two different impedance values. If the fuse F3 is blown, the impedance of the fuse F3 is larger than the impedance of the always turned-on PMOS transistor whose gate is coupled to the ground terminal GND. If the fuse F3 is not blown, the impedance of the fuse F3 is smaller than the impedance of the always on PMOS transistor. In some embodiments, the sensing circuit 4 can be implemented by any sensing circuit which does not require a reference resistor according to requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An efuse device operating in a write mode and a read mode and comprising:
    a source line;
    a cell having a first terminal coupled to the source line and a second terminal;
    a blow device coupled between the second terminal of the cell and a ground terminal, wherein the blow device is turned on in the read mode; and
    a sensing circuit, coupled to the first terminal of the cell and the ground terminal, for determining a state of the cell, wherein the sensing circuit further comprises:
    an isolation unit coupled between the first terminal of the cell and a first terminal of a reference resistor, wherein the isolation unit is turned off in the write mode and on in the read mode;

a pre-charging unit having first and second input nodes and coupled to the isolation unit, wherein the pre-charging unit charges voltages at the first and second nodes to a predetermined level before the isolation unit is turned on, and the first and second input nodes respectively receive a first voltage of the first terminal of the cell and a second voltage of the first terminal of the reference resistor when the isolation unit is turned on;

an amplifying unit coupled to the first and second input nodes of the pre-charging unit and amplifying the first and second voltages; and an output unit receiving the amplified first and second voltages and outputting an output signal according to the amplified first and second voltages.

2. The efuse device as claimed in claim 1, wherein when the blow device is turned on in the write mode, the source line provides a current for blowing the cell.

3. The efuse device as claimed in claim 1, wherein the sensing circuit comprises the reference resistor having the first terminal and a second terminal, wherein in the read mode, the second terminal of the reference resistor receives a ground voltage from the ground terminal, and the sensing circuit determines the state of the cell according to impedances of the cell and the reference resistor.

4. The efuse device as claimed in claim 3, wherein the sensing circuit further comprises a switch device coupled between the second terminal of the reference resistor and the ground terminal, wherein the switch device is turned on in the read mode.

5. The efuse device as claimed in claim 1, wherein the cell comprises a fuse, and whether the fuse is blown or not is determined according to the output signal.

6. The efuse device as claimed in claim 1, wherein a ratio of the first voltage to the second voltage is proportional to a ratio of the impedances of the cell to the reference resistor.

7. The efuse device as claimed in claim 1, wherein in the read mode, the sensing circuit generates an output signal according to an impedance of the cell.

8. The efuse device as claimed in claim 7, wherein the cell comprises a fuse, and whether the fuse is blown or not is determined according to the output signal.

9. An efuse device operating in a write mode and a read mode and comprising:
a source line;
a cell having a first terminal coupled to the source line and a second terminal;
a blow device coupled between the second terminal of the cell and a ground terminal providing a ground voltage; and
a sensing circuit coupled to the first terminal of the cell and the ground terminal and comprising a reference resistor, wherein the reference resistor has a first terminal coupled to the sensing circuit and a second terminal, wherein the second terminal of the reference resistor is coupled to the ground voltage in the read mode;
wherein in the read mode, the blow device is turned on, and the sensing circuit determines a state of the cell according to impedances of the cell and the reference resistor, wherein the sensing circuit further comprises:
an isolation unit coupled between the first terminal of the cell and the first terminal of the reference resistor, wherein the isolation unit is turned off in the write mode and on in the read mode;
a pre-charging unit having first and second input nodes and coupled to the isolation unit, wherein the pre-charging unit charges voltages at the first and second nodes to a predetermined level before the isolation unit is turned on, and the first and second input nodes respectively receive a first voltage of the first terminal of the cell and a second voltage of the first terminal of the reference resistor when the isolation unit is turned on;
an amplifying unit coupled to the first and second input nodes of the pre-charging unit and amplifying the first and second voltages; and
an output unit receiving the amplified first and second voltages and outputting an output signal according to the amplified first and second voltages.

10. The efuse device as claimed in claim 9, wherein when the blow device is turned on in the write mode, the source line provides a current for blowing the cell.

11. The efuse device as claimed in claim 9, the sensing circuit further comprises a switch device coupled between the second terminal of the reference resistor and the ground terminal, wherein the switch device is turned on in the read mode.

12. The efuse device as claimed in claim 9, wherein the cell comprises a fuse, and whether the fuse is blown or not is determined according to the output signal.

13. The efuse device as claimed in claim 9, wherein a ratio of the first voltage to the second voltage is proportional to a ratio of the impedances of the cell to the reference resistor.

14. An efuse device operating in a write mode and a read mode and comprising:
a source line;
a cell having a first terminal coupled to the source line and a second terminal;
a blow device coupled between the second terminal of the cell and a ground terminal; and
a sensing circuit, coupled to the first terminal of the cell and the ground terminal, for determining whether the cell is blown or not; wherein the sensing circuit further comprises:
an isolation unit coupled between the first terminal of the cell and a first terminal of a reference resistor, wherein the isolation unit is turned off in the write mode and on in the read mode;
a pre-charging unit having first and second input nodes and coupled to the isolation unit, wherein the pre-charging unit charges voltages at the first and second nodes to a predetermined level before the isolation unit is turned on, and the first and second input nodes respectively receive a first voltage of the first terminal of the cell and a second voltage of the first terminal of the reference resistor when the isolation unit is turned on;
an amplifying unit coupled to the first and second input nodes of the pre-charging unit and amplifying the first and second voltages; and
an output unit receiving the amplified first and second voltages and outputting an output signal according to the amplified first and second voltages;
wherein in the read mode, the blow device is turned on; and
wherein when the blow device is turned on in the write mode, the source line provides a current for blowing the cell.

15. The efuse device as claimed in claim 14, wherein the sensing circuit comprises the reference resistor having the first terminal and a second terminal, wherein in the read mode, the second terminal of the reference resistor receives a ground voltage from the ground terminal, and the sensing circuit determines the state of the cell according to impedances of the cell and the reference resistor.

16. The efuse device as claimed in claim 15, the sensing circuit further comprises a switch device coupled between the second terminal of the reference resistor and the ground terminal, wherein the switch device is turned on in the read mode.

17. The efuse device as claimed in claim 14, wherein the sensing circuit determines the state of the cell according to an impedance of the cell.

* * * * *